United States Patent
Song et al.

(10) Patent No.: US 11,714,217 B2
(45) Date of Patent: Aug. 1, 2023

(54) LIGHT CONTROL FILM HAVING NANO LIGHT ABSORBING LAYER AND DISPLAY USING THE SAME

(71) Applicant: LG Display Co., Ltd., Seoul (KR)

(72) Inventors: Youngki Song, Paju-si (KR); SunMan Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 322 days.

(21) Appl. No.: 17/111,160

(22) Filed: Dec. 3, 2020

(65) Prior Publication Data

US 2021/0181385 A1 Jun. 17, 2021

(30) Foreign Application Priority Data

Dec. 12, 2019 (KR) .......................... 10-2019-0165551

(51) Int. Cl.
*G02B 5/00* (2006.01)
*G02B 5/04* (2006.01)
*H10K 50/858* (2023.01)
*H10K 50/86* (2023.01)

(52) U.S. Cl.
CPC ............. *G02B 5/003* (2013.01); *G02B 5/045* (2013.01); *H10K 50/858* (2023.02); *H10K 50/865* (2023.02)

(58) Field of Classification Search
None
See application file for complete search history.

(56) References Cited

U.S. PATENT DOCUMENTS

| 10,809,445 | B2 | 10/2020 | Johnson et al. | |
| 2010/0328777 | A1* | 12/2010 | Kashiwagi | H01J 11/44 427/510 |
| 2016/0103262 | A1* | 4/2016 | Kashiwagi | G02B 5/223 362/607 |
| 2016/0124126 | A1* | 5/2016 | Vasylyev | G02B 5/003 359/893 |
| 2018/0267358 | A1* | 9/2018 | Choi | H01L 27/3276 |
| 2019/0346615 | A1 | 11/2019 | Johnson et al. | |
| 2020/0168838 | A1* | 5/2020 | Hong | H10K 71/00 |
| 2021/0333624 | A1* | 10/2021 | Schmidt | G02B 5/305 |

FOREIGN PATENT DOCUMENTS

| KR | 10-2014-0012453 A | 2/2014 |
| KR | 10-2017-0063165 A | 6/2017 |
| KR | 10-2019-0099304 A | 8/2019 |

* cited by examiner

*Primary Examiner* — Nduka E Ojeh
(74) *Attorney, Agent, or Firm* — Fenwick & West LLP

(57) ABSTRACT

The present disclosure relates to a light control film having nano (or nano-scale) light absorbing layer and a display using the same. A light control film according to the present disclosure comprises: a lower layer having a first axis and a second axis; an upper layer facing with the lower layer; a middle layer having a thickness disposed between the lower layer and the upper layer; a plurality of nano light absorbing layers arrayed with a predetermined interval along the first axis in the middle layer, each of the nano light absorbing layer having a width along the first axis, a length along the second axis and a height corresponding to the thickness of the middle layer; and a prism pattern disposed between each pair of the nano light absorbing layers.

20 Claims, 12 Drawing Sheets

5a ≠ 5b

5a ≠ 5b ≠ 5c

LIGHT CONTROL FILM HAVING NANO LIGHT ABSORBING LAYER AND DISPLAY USING THE SAME

CROSS-REFERENCE TO RELATED APPLICATIONS

This application claims the benefit of Republic of Korea Patent Application No. 10-2019-0165551 filed on Dec. 12, 2019 which is hereby incorporated by reference in its entirety.

BACKGROUND

Field

The present disclosure relates to a light control film having nano (or nano-scale) light absorbing layer and a display using the same. Especially, the present disclosure relates to a light control film for narrowly controlling the viewing angle of the display in a specific direction.

Discussion of the Related Art

Recently, various types of display such as CRT (cathode ray tube), LCD (liquid crystal display), PDP (plasma display panel) and luminescent display have been developed and prospered. These various types of display are used to display image data of various products such as computers, mobile phones, bank teller machines (ATMs) and vehicle navigation systems in accordance with their unique characteristics.

The display provides the image information required to the users. It is generally developed to have a wide viewing angle in order to allow the user to view images of the display regardless of the angular directions. However, depending on the purpose or configuration of the product to which the display device is applied, the wide viewing angle may adversely affect the characteristics of the product. In that case, the product may require a display having a narrow viewing angle.

For example, in the case of bank deposit/withdrawal device (i.e., ATM), it is more desirable that the ATM may be equipped with a display having a narrow viewing angle because it is required to prevent other people from recognizing personal information when any user inputs his personal information on the screen of the ATM. In the case of a vehicle navigation system, when the viewing angle of the display is wide, light may be reflected on the windshield of the vehicle during driving the vehicle, which may adversely affect the safety of the driver. In addition, in the case of a computer or a mobile phone, even though the user does not want to expose the privacy data, the wide viewing angle of the display is contrary to the user's request.

It is necessary to design and manufacture the display by adjusting the viewing angle according to the field to which the display is applied. However, when the wide viewing angle display and the narrow viewing angle are manufactured separately according to the requirements of the product, the productivity is poor. Therefore, after manufacturing a display having a wide viewing angle, a method for narrowing the viewing angle according to the field to which it is applied has been devised. In response to the needs of this situation, a light control film has been developed that can be attached to the display front surface of the display to narrow the viewing angle.

The light control film according to the conventional technology has a problem in that its precision is poor and the brightness of the display is degraded. In addition, under the condition in which external light reflection is severe, when the brightness of the display is dark, it may be difficult to accurately recognize image information of the display. Therefore, demands for a high-precision light control film having a new structure is increasing.

SUMMARY

The purpose of the present disclosure is to overcome the problems of the conventional art, to provide a light control film and a display having the same to control the viewing angle without lowering the brightness of the display. Another purpose of the present disclosure is to provide a light control film and display having the same that reduces reflection of light outside the display from the surface of the display and does not degrade the display quality.

In order to accomplish the above mentioned purposes of the present disclosure, a light control film according to the present disclosure includes: a lower layer having a first axis and a second axis; an upper layer facing with the lower layer; a middle layer having a thickness disposed between the lower layer and the upper layer; a plurality of nano light absorbing layers arrayed with a predetermined interval along the first axis in the middle layer, each of the nano light absorbing layer having a width along the first axis, a length along the second axis and a height corresponding to the thickness of the middle layer; and a prism pattern disposed between each pair of the nano light absorbing layers.

In one example, the width of the nano light absorbing layer is selected any one in range of 0.1 µm to 1.0 µm.

In one example, the ratio between the interval and the height of the nano light absorbing layer is selected any one of 1:1 to 1:4.

In one example, each of the lower layer, the middle layer and the upper layer have refractive index higher than that of air, respectively.

In one example, each of the nano light absorbing layer has at least two thin layers stacked each other.

In one example, any one thin layer of the nano light absorbing layer has a film thickness selected one of 0.01 µm to 0.1 µm.

In one example, the nano light absorbing layer includes: a first thin layer having a first reflection ratio; and a second thin layer having a second reflection ratio different from the first reflection ratio.

In one example, the nano light absorbing layer further includes a third thin layer having a third reflection ratio different from the first and second reflection ratios.

In one example, the nano light absorbing layer includes: a first thin layer having a first transmittance ratio; and a second thin layer having a second transmittance ratio different from the first transmittance ratio.

In one example, the nano light absorbing layer further includes a third thin layer having a third transmittance ratio different from the first and second transmittance ratios.

In one example, the prism pattern is in contact with the lower layer, the lower layer and the prism pattern have a first refractive index, and the middle layer and the upper layer have a second refractive index larger than the first refractive index.

In one example, a cross-sectional shape of the prism pattern is an isosceles triangle of which base side is in contact with the lower layer, and a base angle of the isosceles triangle is any one in range of 45 degree to 75 degree.

In one example, the prism pattern has a cross-sectional shape of trapezoid including: a lower side being in contact with the lower layer; an upper side parallel to the lower side; a left slanted side connecting the lower side and the upper side; and a right slanted side connecting the lower side and the upper side. A base angle of the trapezoid is any one in range of 45 degree to 75 degree. Horizontal widths of the left slanted side, the upper side and the right slanted side have a ratio in range of 1:1:1 to 1:3:1.

In one example, the prism pattern is in contact with the upper layer, the upper layer and the prism pattern have a first refractive index, and the middle layer and the lower layer have a second refractive index larger than the first refractive index.

In one example, a cross-sectional shape of the prism pattern is an isosceles triangle of which base side is in contact with the upper layer, and a base angle of the isosceles triangle is any one in range of 45 degree to 75 degree.

In one example, the prism pattern has a cross-sectional shape of trapezoid including: a lower side being in contact with the upper layer; an upper side parallel to the lower side; a left slanted side connecting the lower side and the upper side; and a right slanted side connecting the Lowe side and the upper side. A base angle of the trapezoid is any one in range of 45 degree to 75 degree. Horizontal widths of the left slanted side, the upper side and the right slanted side have a ratio in range of 1:1:1 to 1:3:1.

In one example, the nano light absorbing layer includes at least selected one of silicon nitride (SiN), titanium nitride (TiN), silicon carbide (SiC), Tantalum (Ta), Titanium (Ti), Tungsten (W), copper oxide (CuO), aluminum oxide (Al2O3), iron oxide (Fe3O4), carbon allotropy and tantalum oxide (Ta2O5).

In one example, the nano light absorbing layer includes: a first sector being in close to the lower layer and having a first width; a third sector being in close to the upper layer and having a third width; and a second sector disposed between the first sector and the second sector, and having a second width wider than the first width and narrower than the second width.

In one example, ratio between the interval and the width of the nano light absorbing layer is in a range of 10:1 to 20:1.

Further, a display according to an example of the present disclosure includes: a substrate having a plurality of pixels; an emission layer including a driving element and a light emitting element disposed at each of pixels; an encapsulation layer covering the emission layer; an optical layer on the encapsulation layer; a cover plate on the optical layer; and a light control film. The light control film includes: a lower layer having a first axis and a second axis; an upper layer facing with the lower layer; a middle layer having a thickness disposed between the lower layer and the upper layer; a plurality of nano light absorbing layers arrayed with a predetermined interval along the first axis in the middle layer, each of the nano light absorbing layer having a width along the first axis, a length along the second axis and a height corresponding to the thickness of the middle layer; and a prism pattern disposed at one side of the middle layer between each pair of the nano light absorbing layers. The ratio between the interval and the width of the nano light absorbing layer is selected any one of 10:1 to 20:1.

The display apparatus according to the present disclosure may include a structure in which a plurality of light absorbing thin layers of nano-units scale are arranged at regular intervals, and the arrangement interval has at least 10 times the thickness of the light absorbing thin layer. Therefore, the light control film according to the present disclosure can secure an aperture ratio of 90% or more, and does not degrade the brightness of the display when applied to a display panel. In addition, one light absorbing thin layer of nano-units may have a plurality of thin layers having different refractive indices or different light absorption rates, so an excellent light absorption rate is ensured even though it has very thin thickness. Therefore, the light control film according to the present disclosure may have the excellent viewing angle control property. Further, due to the structure in which a plurality of nano scale light absorbing thin layers are continuously disposed, it has a function of polarization film for preventing external light reflection. That is, the present disclosure may provide a display panel with a thin thickness while having an anti-reflection function without any additional optical film.

In addition, as including a plurality of prism patterns at one side of the middle layer between each nano light absorbing layer, most of all light, which may go out of the viewing angle due to the total reflection by the nano light absorbing layer, would be controlled to be concentrated into the front direction. As the result, the front brightness (or luminescent) may be enhanced.

In addition to the effects of the present disclosure mentioned above, other features and advantages of the present disclosure may be described below, or may be clearly understood by those skilled persons in this art from such below descriptions and explanations.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
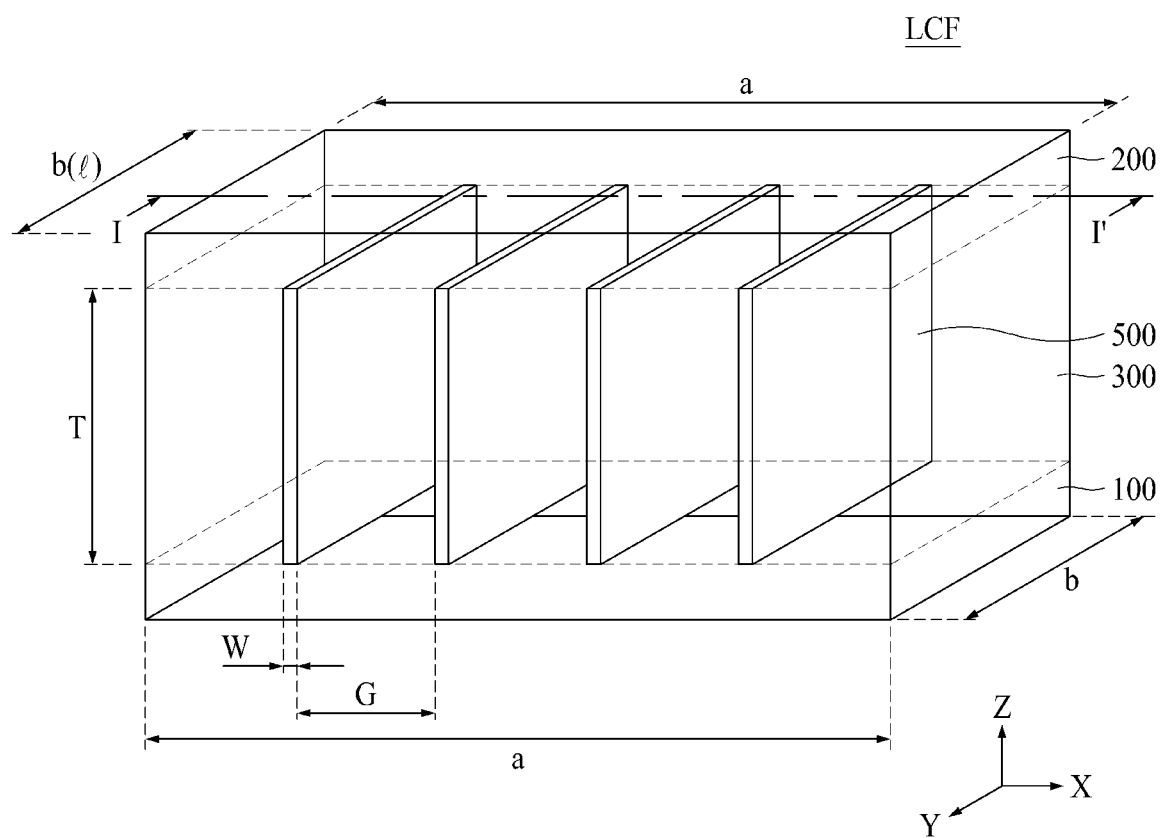
FIG. 1 is a perspective view illustrating a structure of the light control film having a nano light absorbing layer according to the first embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as the first, the second, A, B, (a) and (b) may be used. These terms are only to distinguish the elements from other elements, and the terns are not limited in nature, order, sequence or number of the elements. When an element is described as being "linked", "coupled" or "connected" to another element that element may be directly connected to or connected to that other element, but indirectly unless otherwise specified. It is to be understood that other elements may be "interposed" between each element that may be connected to or coupled to.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an example of a display apparatus according to the present disclosure will be described in detail with reference to the accompanying drawings. In designating reference numerals to elements of each drawing, the same components may have the same reference numerals as much as possible even though they are shown in different drawings. Scale of the elements shown in the accompanying drawings have a different scale from the actual for convenience of description, it is not limited to the scale shown in the drawings.

First Embodiment

Figure 2:
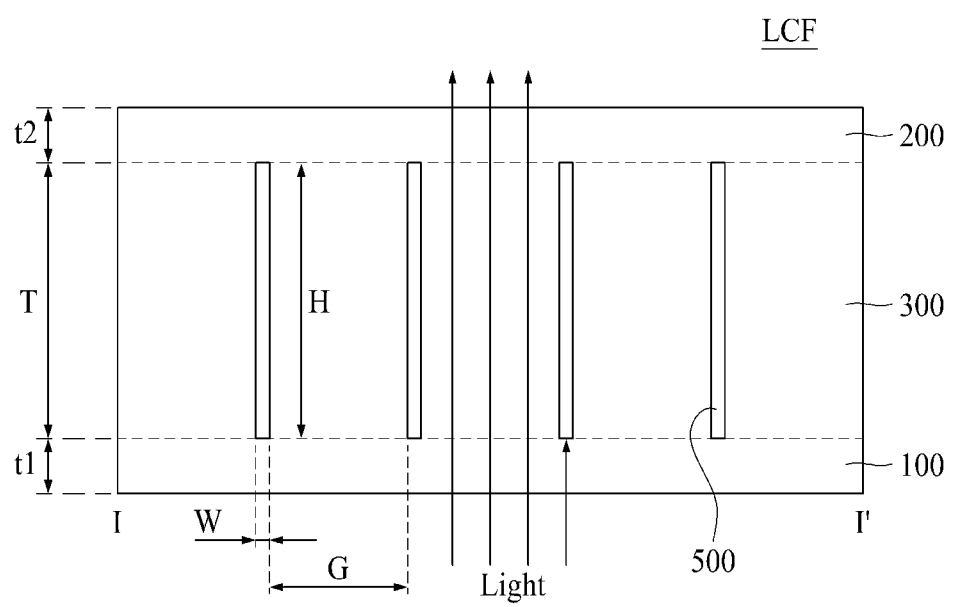
FIG. 2 is a cross-sectional view along cutting line I-I' in FIG. 1, for illustrating a structure of a light control film having a plurality of nano light absorbing layers according to the first embodiment of the present disclosure.

Hereinafter, referring to figures, we will explain about the light control film having nano light absorbing layers according to the first embodiment of the present disclosure. FIG. 1 is a perspective view illustrating a structure of the light control film having a nano light absorbing layer according to the first embodiment of the present disclosure. FIG. 2 is a cross-sectional view along cutting line I-I' in FIG. 1, for illustrating a structure of a light control film having a plurality of nano light absorbing layers according to the first embodiment of the present disclosure.

Referring to FIGS. 1 and 2, the light control film LCF according to the first embodiment of the present disclosure may comprise a lower layer 100, an upper layer 200, a middle layer 300, and a nano light absorbing layer 500. The lower layer 100 may be a thin plate or film having a first thickness t1. The upper layer 200 may be a thin plate or film having a second thickness t2 and the same shape with the lower layer 100. The first thickness t1 and the second thickness t2 may be the same. The lower layer 100 and the upper layer 200 may be facing a certain distance or gap. The middle layer 300 is disposed or filled between the lower layer 100 and the upper layer 200.

The light control film LCF may be an optical film having the function to emit incident light only within a certain angular range. Therefore, the lower layer 100, the upper layer 200 and the middle layer 300 may include a transparent organic material. For example, they may include at least any one of acrylic resin material, polyvinyl chloride (PVC), polyethylene terephtahalate (PET), polyacrylate, polyurethane, polycarbonate and polypropylene.

In one embodiment, the nano light absorbing layer 500 may have the light absorbing property. Specifically, in one embodiment the nano light absorbing layer 500 may include a material absorbing visible light having wavelength range of 400 nm to 800 nm. For example, the nano light absorbing layer 500 may include an opaque material such as a metal material, a metal oxide material, a nitride material or carbon allotropy. In detail, the nano light absorbing layer 500 may include at least selected one of silicon nitride (SiN), titanium nitride (TiN), silicon carbide (SiC), Tantalum (Ta), Titanium (Ti), Tungsten (W), Nickel (Ni), copper oxide (CuO), aluminum oxide (Al2O3), iron oxide (Fe3O4), nickel oxide (NiO) and tantalum oxide (Ta2O5). Otherwise, the nano light absorbing layer 500 may include carbon allotropy such as graphine, carbon nano tube or fullerene (C60). The nano light absorbing layer 500 may be formed of organic material having excellent light absorbing property.

Referring to FIG. 1, the lower layer 100 may have a plate structure disposed on a plan including X axis and Y axis. The upper layer 200 may have the same shape with the lower layer 100 and be spaced apart from the lower layer 100 with a predetermined distance on Z axis. The middle layer 300 may be inserted between the lower layer 100 and the upper layer 200 and have a thickness T on the Z axis.

The nano light absorbing layer 500 may have a width W having a value in nano scale on the X axis, a length l along the Y axis, and a height H corresponding to the thickness T of the middle layer 300. A plurality of nano light absorbing layers 500 may be arranged at regular intervals G along the X axis in the middle layer 300. Especially, the ratio between the interval G of the nano light absorbing layers 500 and the width W of the nano light absorbing layer 500 may have any selected one from 10:1 to 20:1.

In detail, the lower layer 100 may have a thin plate structure with length of a, width of b and first thickness of t1, and the upper layer 200 may have a thin plate structure with length of a, width of b and second thickness of t2. The middle layer 300 may have a cubic structure disposed between the lower layer 100 and the upper layer 200. For example, the middle layer 300 may be a cuboid shape having length of a, width of b and thickness of T. The lower layer 100, the middle layer 300 and the upper layer 200 may be sequentially stacked from bottom to up.

The light control film LCF may have a louver structure in which a plurality of nano light absorbing layers 500 are arrayed with a constant interval G between the lower layer 100 and the upper layer 300. The nano light absorbing layer 500 may have a plurality of vertical plates arrayed with the constant interval G inside of the middle layer 300. For example, the nano light absorbing layer 500 may be a thin plate structure having a length L, a height H and a width W. The plurality of nano light absorbing layers 500 may be arrayed with the constant gap or interval G.

Here, the length l of the nano light absorbing layer 500 may be the same as the width b of the lower layer. The height H of the nano light absorbing layer 500 may be the same as the thickness T of the middle layer 300. In one embodiment, the width W of the nano light absorbing layer 500 may have a nano-scale value.

For example, the width W of the nano light absorbing layer 500 may have any one value in range of 0.1 μm to 1.0 μm. The arrangement interval G of the nano light absorbing layers 500 may have any one value in a range of 1.0 μm to 10.0 μm. Here, the ratio of the interval G versus the width W of the nano light absorbing layer 500 may have any one value in a range of 10:1 to 20:1. As the result, the transmittance of light penetrating from the lower layer 100 to the upper layer 200 may be ensured at least 95%.

As shown in FIG. 2, when irradiating light in the normal direction from the surface of the lower layer 100, little portions of light are absorbed or blocked by the cross section area of the nano light absorbing layer 500. Most of light passing through the middle layer 300 are transmitted and then emitted out of the upper layer 200. According to the structure of the present disclosure, as the width W of the nano light absorbing layer 500 is 10 μm or less and the arrangement interval G is set to at least 5 times or more of the width W, the transmittance may be a very high value of 95% or more.

In one embodiment, the width W, the height H, and the arrangement interval G of the of the nano light absorbing layer 500 and their relationships may be set with respect to the width W. Especially, these values may be defined according to the structural features and purpose of the application fields of the light control film having the nano light absorbing layer 500. For the case that the width W of the nano light absorbing layer 500 is 1.0 μm or less, the arrangement interval G may be defined as 10-20 times of the width W. In another case that the width W of the nano light absorbing layer 500 is 1.0 μm or more, the arrangement interval G may be defined as 5-10 times of the width W.

In detail, the nano light absorbing layer 500 may have a thin plate shape of which the width W is 0.1 μm and the height H is 25 μm. In this case, a plurality of the nano light absorbing layers 500 may be arranged with the arrangement interval G of 1.0 μm which is 10 times of the width W. In another example, the nano light absorbing layer 500 may have a width W of 10 μm and the height H of 100 μm. In that case, a plurality of the nano light absorbing layer 500 may be arranged with the arrangement interval G of 60 μm which is 6 times of the width W.

Figure 3A:
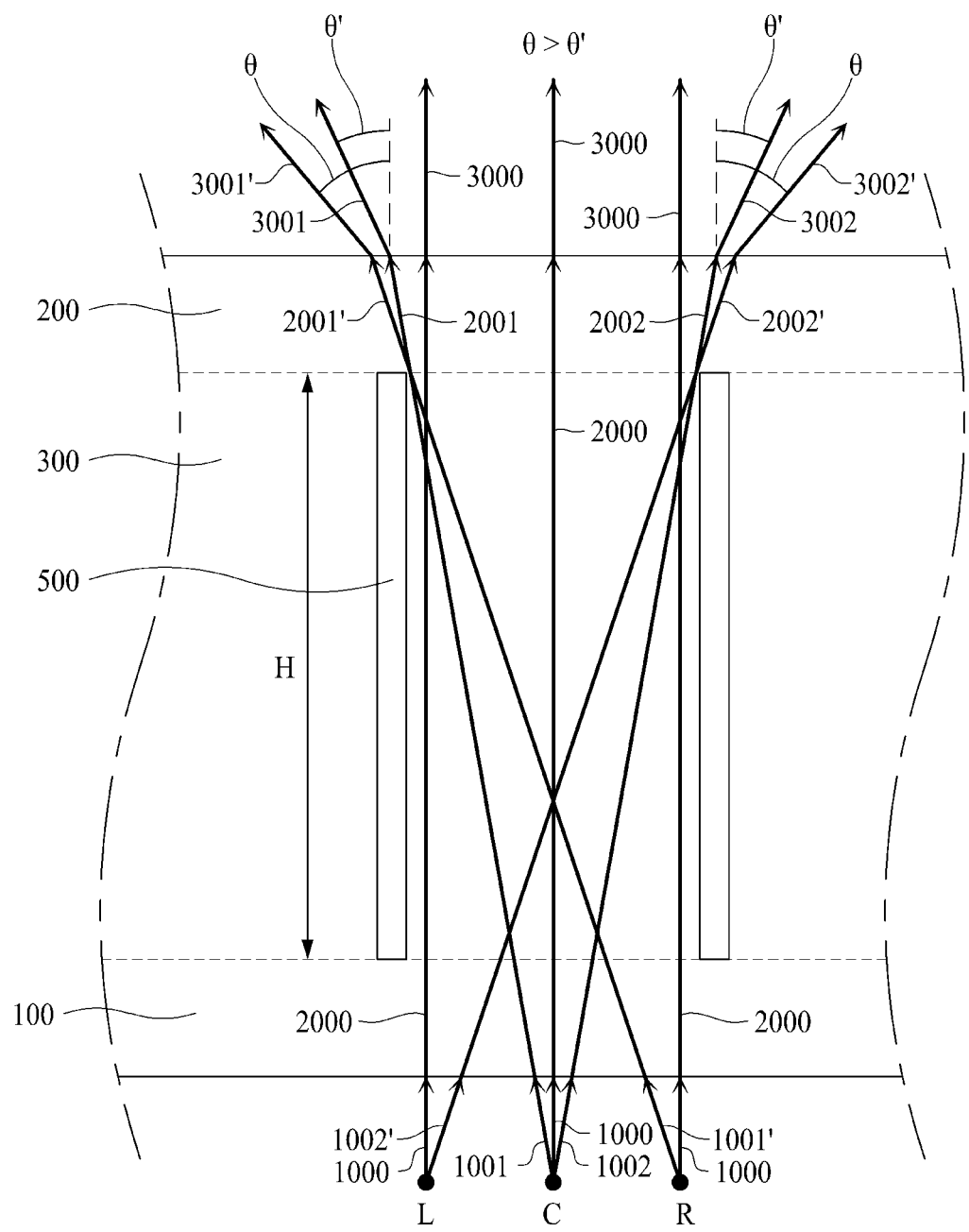
FIG. 3A is an enlarged cross-sectional view along cutting line I-I' in FIG. 1, for illustrating an arrangement structure of the nano light absorbing layers included into the light control film according to the first embodiment of the present disclosure.

Hereinafter, referring to FIG. 3A, the viewing angle controlling mechanism of the nano light absorbing layer 500 included in the light control film LCF according to the first embodiment of the present disclosure will be explained. FIG. 3A is an enlarged cross-sectional view along cutting line I-I' in FIG. 1, for illustrating an arrangement structure of the nano light absorbing layers included into the light control film according to the first embodiment of the present disclosure.

The light controlling performance of the light control film LCF according to the first embodiment of the present disclosure may be decided by the relationship between the arrangement interval G and the height H in the nano light absorbing layer 500. For example, the ratio between the arrangement interval G and the height H of the nano light absorbing layer 500 may be selected any one value in range of 1:1 to 1:4. In one embodiment, the ratio between interval G and height H may be selected any one value in range of 1:2 to 1:3.2. In one embodiment, the ratio between interval G and height H may be 1:2.6.

The arrangement pitch of the nano light absorbing layer 500 may be defined as the summation of thickness and interval G of the nano light absorbing layer 500. In this application, the thickness of the nano light absorbing layer 500 is very thin compared to the interval G. Therefore, the ratio between the interval G and the height H may be replaced with the ratio between the pitch and the height H.

Referring to FIG. 3A, the light is incident from the lower outside of the light control film LCF to the lower surface of the lower layer 100. In many cases, the light control film LCF according to the first embodiment of the present disclosure may be attached on the top surface of the display panel. As the lower layer 100 may have similar refractive index as the display panel, the incident light is not refracted but enters into the lower layer 100 as a straight line path.

When the lower layer 100, the middle layer 300 and the upper layer 200 may be made of the same material, there is no difference in refractive index, so that the transmitted light passing through the light control film LCF may be a straight line parallel to and extended from the incident light. The upper layer 200 may be the upper most layer in the display panel including the light control film LCF. In this case, the upper surface of the upper layer 200 may be contacted with air. When the refractive index of the upper layer 200 is greater than air, the emitted (or out-going) light may be refracted in a direction further away from the normal direction of the surface of the upper layer 200.

We will explain in detail referring to FIG. 3A. It can be considered that the light incident from the lower outside of the light control film LCF may be incident on 3 areas divided into a center area C, a left area L and a right area R.

In the central area C, the incident light may be divided into a vertical incident light 1000 parallel to the normal direction of the surface of the light control film LCF, a left incident light 1001 slanted (or inclined) to left direction from the normal direction, and a right incident light 1002 slanted to right direction from the normal direction. The vertical incident light 1000 is incident into the lower layer 100 along the normal direction, and propagates to the vertical transmitted light 2000 passing through the lower layer 100, the middle layer 300 and the upper layer 200 sequentially. Then, the light is emitted as the vertical emission light 3000 out of the light control film LCF.

Some of the left incident light 1001 entering between upper end and lower end of the nano light absorbing layer 500 may be mostly absorbed by the nano light absorbing layer 500. The light closer to normal direction than the light to the upper end of the nano light absorbing layer 500 may go forward as a left transmitted light 2001 passing the lower layer 100, the middle layer 300 and the upper layer 200. After passing the upper layer 200, the left transmitted light 2001 may go out of the light control film LCF as a left emission light 3001. As there is air layer on the outside of the light control film LCF, the left emission light 3001 may be refracted in a direction away from the normal direction. That is, the left emission light 3001 may have a refracted angle θ' between the normal direction and the emission direction.

With the same method, some of the right incident light 1002 entering between upper end and lower end of the nano light absorbing layer 500 may be mostly absorbed by the nano light absorbing layer 500. The light closer to normal direction than the light to the upper end of the nano light absorbing layer 500 may go forward as a right transmitted light 2002 passing the lower layer 100, the middle layer 300 and the upper layer 200. After passing the upper layer 200, the right transmitted light 2002 may go out of the light control film LCF as a right emission light 3002. As there is air layer having lower refractive index on the outside of the light control film LCF, the right emission light 3002 may be refracted in a direction away from the normal direction. That is, the right emission light 3002 may have a refracted angle θ' between the normal direction and the emission direction.

The light entering from the left area L may be divided into a vertical incident light 1000 parallel to the normal direction of the surface of the light control film LCF and a right incident light 1002' slanted to right direction from the normal direction. As the nano light absorbing layer 500 is closely disposed at the left side of the left area L, all of the light going to left side may be absorbed by the nano light absorbing layer 500, so left incident light is not considered in the left area L. The vertical incident light 1000 is incident into the lower layer 100 along the normal direction, and propagates to the vertical transmitted light 2000 passing through the lower layer 100, the middle layer 300 and the upper layer 200 sequentially. Then, the light is emitted as the vertical emission light 3000 out of the light control film LCF.

Some of the right incident light 1002' entering between upper end and lower end of the nano light absorbing layer 500 may be mostly absorbed by the nano light absorbing layer 500. The light closer to normal direction than the light to the upper end of the nano light absorbing layer 500 may go forward as a right transmitted light 2002' passing the lower layer 100, the middle layer 300 and the upper layer 200. After passing the upper layer 200, the right transmitted light 2002' may go out of the light control film LCF as a right emission light 3002'. As there is air layer on the outside of the light control film LCF, the right emission light 3002' may be refracted in a direction away from the normal direction. That is, the right emission light 3002' may have a refracted angle θ between the normal direction and the emission direction.

The light entering from the right area R may be divided into a vertical incident light 1000 parallel to the normal direction of the surface of the light control film LCF and a left incident light 1001' slanted to right direction from the normal direction. As the nano light absorbing layer 500 is closely disposed at the right side of the right area R, all of the light going to right side may be absorbed by the nano light absorbing layer 500, so right incident light is not considered in the right area R. The vertical incident light 1000 is incident into the lower layer 100 along the normal direction, and propagates to the vertical transmitted light 2000 passing through the lower layer 100, the middle layer 300 and the upper layer 200 sequentially. Then, the light is emitted as the vertical emission light 3000 out of the light control film LCF.

Some of the left incident light 1001' entering between upper end and lower end of the nano light absorbing layer 500 may be mostly absorbed by the nano light absorbing layer 500. The light closer to normal direction than the light to the upper end of the nano light absorbing layer 500 may go forward as a left transmitted light 2001' passing the lower layer 100, the middle layer 300 and the upper layer 200. After passing the upper layer 200, the left transmitted light 2001' may go out of the light control film LCF as a left emission light 3001'. As there is air layer on the outside of the light control film LCF, the left emission light 3001' may be refracted in a direction away from the normal direction. That is, the left emission light 3001' may have a refracted angle θ between the normal direction and the emission direction.

As a result, the viewing angle θ may be determined by the refracted angle θ, the angle of emission light, that determines a transmitting direction of light transmitted and through out of the light control film LCF according to the first embodiment of the present disclosure.

In one example, when ratio between the arrangement interval G and height H of the nano light absorbing layer 500 has 1:1 in the light control film, the viewing angle may be 45°±5° in one direction based on the vertical surface of the nano light absorbing layer 500. Considering the trigonometric function, it may be calculated that the viewing angle is 45° in one direction from the normal direction. When light passes through the light control film LCF and is emitted into the air, in the case that the refractive index of the light control film LCF has a value higher than that of the air, the viewing angle may become larger by the difference in the refractive index. Therefore, the viewing angle may be any one of 45°±5° depending on the refractive index of the light control film LCF. Here, for convenience, the thickness of the lower layer 100 and the upper layer 200 is much thinner than that of the middle layer 300, so the difference in the optical path due to the thickness of the lower layer 100 and the upper layer 200 may be not considered.

In another case that the ratio between the arrangement interval G and the height H of the nano light absorbing layer 500 is 1:2, the viewing angle may be 63.4°±5° in one direction based on the nano light absorbing layer 500. For still another case that the ratio between the interval G and the height H of the nano light absorbing layer 500 is 1:3, the viewing angle may be 71.5°±5° in one direction based on the nano light absorbing layer 500.

For the case that the ratio between the interval G and the height H of the nano light absorbing layer 500 is 1:4, the viewing angle may be 76°±5° in one direction based on the nano light absorbing layer 500. Consequently, the larger the height H compared to the interval G, the narrower the viewing angle. By selecting the ratio between the interval G and the height H of the nano light absorbing layer 500, it is possible to provide a viewing angle suitable for the requirement of the display.

In one example in the first embodiment of the present disclosure, the ratio between the interval G and the height H may be 1:2.6. In this case, the viewing angle may be 68.9°±5° in one direction based on the nano light absorbing layer 500. Applying this viewing angle to a vehicle navigation system or head up display (HUD), a product ensuring the safest driving environment for the driver can be produced.

Figure 4A:
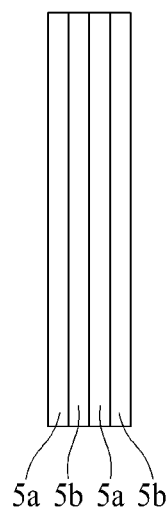
FIGS. 4A and 4B are enlarged cross-sectional views illustrating structures of a nano light absorbing layer included into the light control film according to the first embodiment of the present disclosure.
Figure 4B:
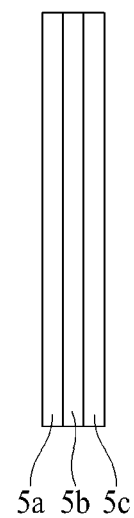

Hereinafter, referring to FIGS. 4A and 4B, we will explain about more detail structure of the nano light absorbing layer included in the light control film LCF according to the first embodiment of the present disclosure. FIGS. 4A and 4B are enlarged cross-sectional views illustrating structures of a nano light absorbing layer included into the light control film according to the first embodiment of the present disclosure.

Referring to FIGS. 4A and 4B, the nano light absorbing layer 500 included in the light control film LCF according to the first embodiment of the present disclosure may have a stacked structure in which at least two thin layers are stacked. For example, the nano light absorbing layer 500 may have a first thin layer and a second thin layer made of different materials each other. Otherwise, a first thin layer, a second thin layer and a third thin layer made of different materials may be sequentially stacked. Further, different n thin layers may be sequentially stacked.

One of a plurality of thin layers including the nano light absorbing layer 500 may have any one width in range of 0.01 μm to 0.1 μm. One of the nano light absorbing layers 500 in which thin film layers having the nano scale width are stacked may have a width of less than 1.0 μm. Here, the 'width' of the nano light absorbing layer 500 is named in consideration of the direction on the drawing, and may be referred to as 'thickness' in another expression. In the name of the element, 'nano' is used because it means that thin film plate having very thin thickness as thinned in the nanometer unit is used.

As the width of the nano light absorbing layer 500 is very thin in nano scale, the absorption rate indicating a performance of blocking light incident on the side surface may be low. In order to ensure the light blocking performance of the nano light absorbing layer 500, a material having a high absorption rate is used.

Considering productivity and material cost, a metal material, a metal oxide material or a nitride material having different reflectances may be alternately stacked to form a nano metal (i.e., nano light absorbing layer) 500 having an enhanced light absorption rate. For example, in the case that the nano light absorbing layer 500 is formed of a plurality of thin layers, one thin layer may be selected any one of silicon nitride (SiN), titanium nitride (TiN), silicon carbide (SiC), Tantalum (Ta), Titanium (Ti), Tungsten (W), Nickel (Ni), copper oxide (CuO), aluminum oxide ($Al_2O_3$), iron oxide ($Fe_3O_4$), nickel oxide (NiO) and tantalum oxide ($Ta_2O_5$).

In one embodiment, the nano light absorbing layer 500 may be formed in a multilayer structure using nickel which is a metal material. The nano light absorbing layer 500 may be formed by sequentially stacking a first nickel metal layer, the nickel oxide layer and a second nickel metal layer.

In another embodiment, the nano light absorbing layer 500 may include a non-metallic material such as a carbon allotrope. The carbon allotropes are made of carbon, but they have different properties from carbon due to different arrangement of atoms. The carbon allotropes may include fullerene, graphene or carbon nano tube. In one example, fullerenes may include C60 fullerenes having fullerene molecules composed of 60 carbon atoms, C70 fullerenes having fullerene molecules composed of 70 carbon atoms, or C76 fullerenes having fullerene molecules composed of 76 carbon atoms.

There are optical properties of a material such as reflection, transmission and absorption. When light enter into a certain material layer, as shown in Equation 1 below, some light are reflected, some are absorbed and others are transmitted.

Incident light (I)=Refection rate (R)+Absorption rate (A)+Transmittance rate (T)=100%  [Equation 1]

As mentioned above, a material having a high absorption rate is used, for manufacturing the excellent nano light absorbing layer using.

In the case of metallic materials, the reflectance of light may be 90% or more. When light enter into the metal layer, electrons are excited above the Fermi level as absorbing the energy of light, and then immediately emit photons. The light absorption and the photon (i.e., energy) emission are almost simultaneously occurred, so that it is recognized as the light is reflected. The remaining 10% may be absorbed or permeated (or transmitted) into the metal layer.

The light absorption and the photon emission are usually performed within 0.1 μm. Therefore, in the case of metal layer having a thickness of tens of nm, most of the light may be not reflected but transmitted. That is, as irradiating light to the nano metal layer, the transmittance rate may have the highest rate value. For example, light are irradiated to a metal layer having tens of nm thickness, the transmittance rate may be 80%, the reflection rate may be 10% and the absorption rate may be 10%.

As different metal materials having different reflection rate are stacked in a nano-scale multi-layer, a large amount of transmitted light can repeat the reflection and reverse-reflection (i.e., resonating) at the interface of the layers in the multi-layer structure. As a result, the light may be trapped inside the nano-scale multi-layer, and may be absorbed as thermal energy while resonating, so that the absorption rate may be increased. This mechanism can also occur in the inorganic thin multi-layer structure in addition to the metallic thin multi-layer. Further, such mechanism may be expected in a specific organic material thin multi-layer.

In detail, as shown in FIG. 4A, the nano light absorbing layer 500 may be formed by alternately stacking a first thin layer 5a having a first reflection rate and a second thin layer 5b having a second reflection rate. In another example, as shown in FIG. 4B, the nano light absorbing layer 500 may be formed by sequentially stacking a first thin layer 5a having a first reflection rate, a second thin layer 5b having a second reflection rate, and a third thin layer 5c having a third reflection rate. For other example, the nano light absorbing layer 500 may be formed by sequentially stacking n thin layers having different reflection rates each other.

In FIGS. 4A and 4B, the first to third thin layers 5a to 5c have a different reflection rate, but, as shown in Equation 1, the nano light absorbing layer may be formed as considering the absorption rate or the transmittance rate depending on the optical properties of the material used. For example, the nano light absorbing layer 500 may be formed by stacking thin layers having different transmittance rate or different absorption rate.

Figure 3B:
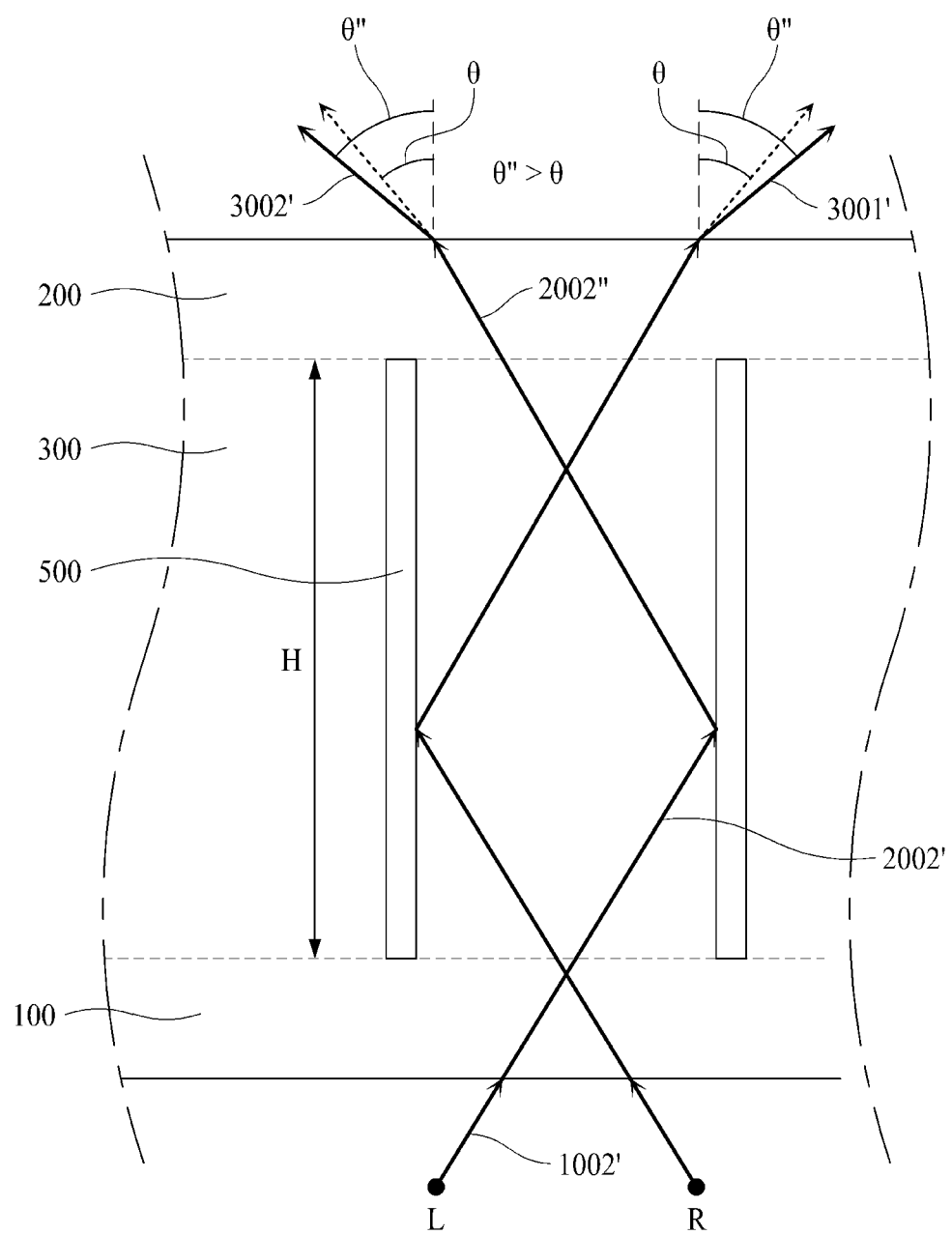
FIG. 3B is a simplified drawing for explaining the light paths of leaked light absorbed by the nano light absorbing layer in the light control film according to the first embodiment of the present disclosure.

As described above, by adjusting the structure and optical properties of the nano layers included in the nano light absorbing layer 500, the light absorption rate of the nano light absorbing layer 500 may be ensured to 90% or more, so that the reflection rate can be set to less than 10%. As shown in FIG. 3B, only 10% or less of the light incident into the nano light absorbing layer 500 may be reflected.

As shown in the light path of FIG. 3B, the reflected light may have an emission angle θ" larger than the viewing angle θ. However, the reflected light is less than 10% of the incident light, so that the amount of leakage light beyond the viewing angle θ can be reduced. FIG. 3B is a simplified drawing for explaining the light paths of leaked light absorbed by the nano light absorbing layer in the light control film according to the first embodiment of the present disclosure.

Referring to FIG. 3B, when the lights incident into the nano light absorbing layer 500 from the bottom of the light control film LCF on one side are reflected, most of the reflected lights may be emitted out from the upper end of the nano light absorbing layer 500 on the opposite side. These light may have an emission angel θ" larger than the viewing angle θ. However, the nano light absorbing layer 500 provided in the light control film LCF according to the present disclosure may reduce the amount of reflected light as the light absorption rate is adjusted to 90% or more.

For an example, we will explain about the light path of the right incident light 1002' incident into the nano light absorbing layer 500 disposed at right side, for the light from the left area L to the lower layer 100. The right incident light 1002' may reach to the nano light absorbing layer 500 as the right transmitted light 2002' passing through the lower layer 100 and the middle layer 300. After reflected by the nano light absorbing layer 500, the light may be the left reflected light 2002" passing through the middle layer 300 and the upper layer 200. After that, the light may be the left emission light 3002' to be radiated out of the light control film LCF. As the upper layer 200 contacts the air layer having relatively low refractive index than the upper layer 200, the left emission light 3002' may be refracted as being further away from the normal direction. That is, the left emission light 3002' may have a reflective viewing angle θ" which is much larger than the viewing angle θ explained in FIG. 3A. Here, the dotted arrow line refers to the left emission light 3001' explained in FIG. 3A which determines the left viewing angle θ.

Therefore, some of the light may be irradiated out of the viewing angle θ which is determined by the design of the light control film LCF. As the light absorbing rate of the nano light absorbing layer 500 is adjusted to 90% or more, the amount of the leaked light out of the viewing angle θ may be controlled in extremely small amount. In addition, for certain display devices, even such a small amount of light may cause inconvenience to the user. Hereinafter, we will explain about the structural features capable of further reducing or completely removing light leaking outside the viewing angle narrowly set.

Second Embodiment

Figure 5:
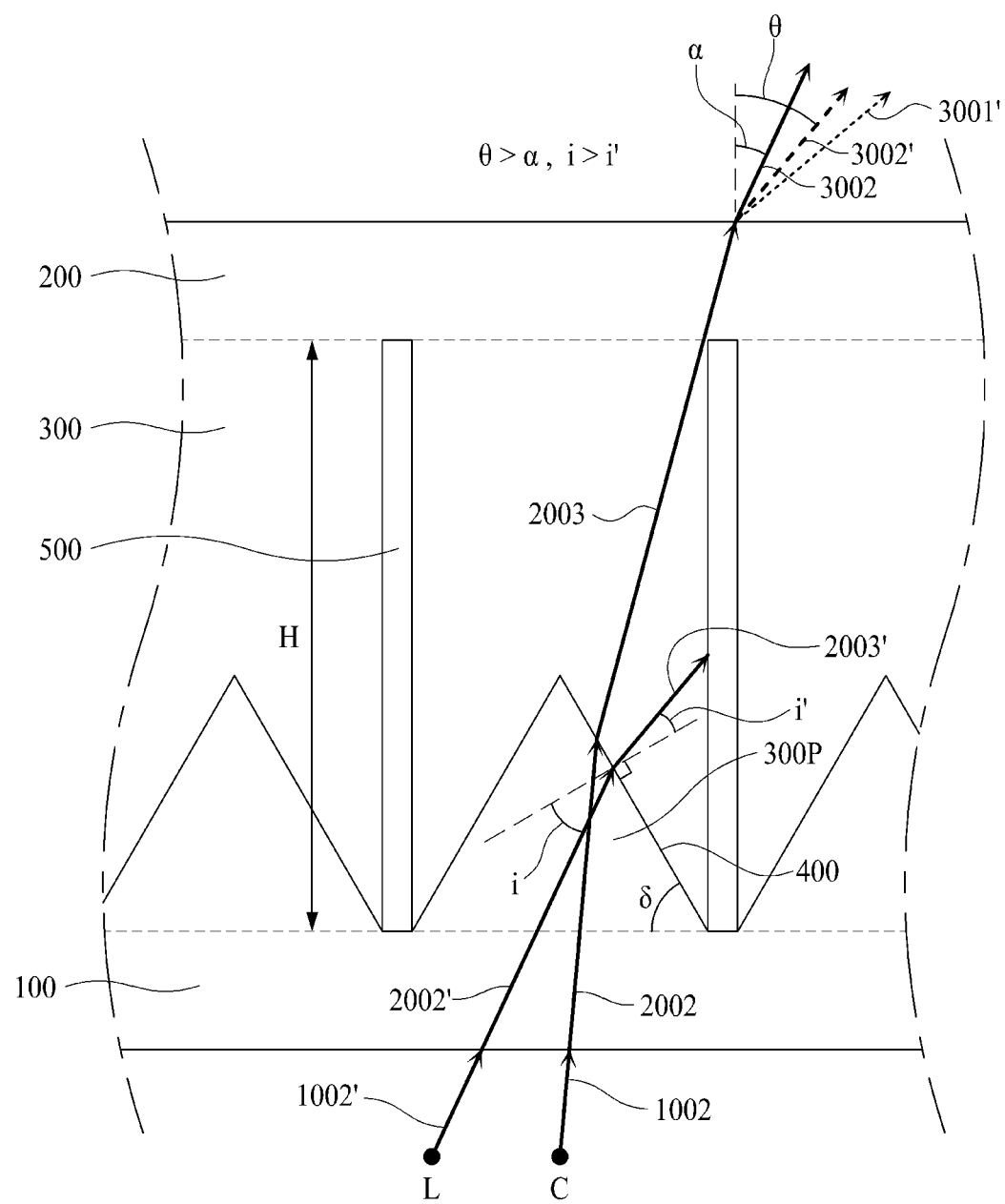
FIG. 5 is a cross-sectional view illustrating a structure of a light control film and an operating mechanism thereof according to the second embodiment of the present disclosure.

Hereinafter, referring to FIG. 5, the second embodiment of the present disclosure will be explained. FIG. 5 is a cross-sectional view illustrating a structure of a light control film and an operating mechanism thereof according to the second embodiment of the present disclosure. The light control film LCF according to FIG. 5 may have a similar structure of the light control film LCF according to FIG. 2. The difference is that the middle layer 300 further includes a prism pattern 300P as contacting on the lower layer 100.

The prism pattern 300P may include a transparent organic material same as the lower layer 100. In this case, the prism pattern 300P may have the same refractive index as the lower layer 100.

On the other hand, the middle layer 300 may include the same transparent organic material as the upper layer 200. Otherwise, the middle layer 300 may include different transparent organic material from the prism pattern 300P. In this case, the middle layer 300 and the upper layer 200 may have higher refractive index than the lower layer 100 and the prism pattern 300P. In one example, the upper layer 200 and the middle layer 300 may have the refractive index of 0.0.5~0.1 higher than the refractive index of the prism pattern 300P and the lower layer 100. In detail, the lower layer 100 and the prism pattern 300P may have the refractive index of 1.40 and the middle layer 300 and the upper layer 200 may have the refractive index of 1.45. In another example, the lower layer 100 and the prism pattern 300P may have the refractive index of 1.40 and the middle layer 300 and the upper layer 200 may have the refractive index of 1.50.

The prism pattern 300P may have a triangular column shape of which cross-sectional shape is a triangle. For example, the bottom side of the triangle may be in contact with the lower layer 100, the upper vertex may be disposed from the inside of the middle layer 300 toward the upper layer 200. In one embodiment, the triangle of the prism pattern 300P may be an isosceles triangle.

The prism pattern 300P according to the second embodiment of the present disclosure is for eliminating the leaked light propagating out of the viewing angle θ. For example, it is for controlling the light that may leak out of the viewing angle θ among the left incident light 1001 and 1001' or the right incident light 1002 and 1002' described in the first embodiment. The base angle δ of the prism pattern 300P may be set as an optimal condition as considering the incident angle of the left incident light or the right incident light. The base angel δ of the prism pattern 300P may have an angle selected one in a range of 45 degree to 75 degree. In one embodiment, the base angle δ of the prism pattern 300P may be any one in range of 60 degree to 70 degree.

Hereinafter, referring to FIG. 5, a mechanism for controlling the viewing angle in the light control film LCF having the prism pattern 300P according to the second embodiment of the present disclosure will be explained. For convenience of explanation, only the light incident from the left area L and the center area C, especially the right incident light is considered.

Among the right incident light 1002' incident from the left area L, the light entering between the upper end and the lower end of the nano light absorbing layer 500 are mostly absorbed by the nano light absorbing layer 500. However, as described in FIG. 3B, a small amount of light may be reflected, which may be become leakage light. Considering the right incident light 1002' that may cause such leakage, it proceeds to the right transmitted light 2002' which propagates without refraction until it passes through the lower layer 100 and the prism pattern 300P. This is because the lower layer 100 and the prism pattern 300P have the same refractive index.

However, the right transmitted light 2002' entering to the interface 400 between the prism pattern 300P and the middle layer 300 may proceed as a right refracted light 2003' which is refracted closer to the normal direction of the interface 400. This is because the refractive index of the middle layer 300 is greater than that of the prism pattern 300P. That is, the angle of refraction i' of the right refracted light 2003' is smaller than the incident angle i of the right transmitted light 2002' incident onto the interface 400.

As the right refracted light 2003' reaches to the nano light absorbing layer 500, the incident angle to the nano light absorbing layer 500 is smaller than the case that there is no prism pattern 300P, so the absorbing rate is increased. That is most of the right refracted light 2003' may be not reflected by the nano light absorbing layer 500 but refracted into the nano light absorbing layer 500. In one embodiment, the refractive index of the nano light absorbing layer 500 may be larger than that of the middle layer 300. When the nano light absorbing layer 500 is made of metal material, the refractive index may be larger than 1.5. As the result, the light control film LCF according to the second embodiment may reduce the amount of leakage light out of the viewing angle θ much more than the light control film LCF according to the first embodiment.

Next, the light incident from the center area C will be explained. For convenience, the right incident light 1002 from the center area C to the right direction will be described. The right incident light 1002 entering to the lower layer 100 passes through the lower layer 200 and the prism pattern 300P as the right transmitted light 2002. At the interface 400 between the prism pattern 300P and the middle layer 300, the right transmitted light 2002 may be refracted in a direction closer to the normal direction of the interface 400. As the result, in the middle layer 300, the right transmitted light 2002 may proceed as a right refracted light 2003. Most of the light reaching to the nano light absorbing layer 500 among the right refracted light 2003 may be refracted and absorbed into the nano light absorbing layer 500 rather than reflected by the nano light absorbing layer 500.

After the right refracted light 2003 that goes out of the top of the nano light absorbing layer 500 passes through the upper layer 200, it becomes the right emission light 3002 to exit the light control film LCF. When the right refractive light 2003 passes through the middle layer 300 and the upper layer 200, it passes through a medium having the same refractive index, so it is not refracted and proceeds in a straight line.

As there is air layer on the outside of the light control film LCF, the right emission light 3002 may be refracted in a direction away from the normal direction. That is, the right emission light 3002 may have a viewing angle α between the normal direction and the emission direction. In the second embodiment, the right emission light 3002 tends to be diffused by the prism pattern 300P, but the final viewing angle α may be smaller than the viewing angle θ is determined by the right emission light 3002' in the first embodiment. That is, the right emission light 3002 in FIG. 5 may be obtained as a result of proceeding within a narrower diffusion range than the optical path of the right incident light 1002' which determines the viewing angle θ in FIG. 3B.

As the result, the light control film LCF according to the second embodiment of the present disclosure has a structure further reducing the leakage light out of the viewing angle θ defined in the light control film LCF according to the first embodiment. In other words, almost all of the light that may have an emission angel θ" of the leakage light are refracted toward the nano light absorbing layer 500 and absorbed by the nano light absorbing layer 500, so that almost of the light are controlled to be limited within the range of the viewing angle θ.

Third Embodiment

Figure 6:
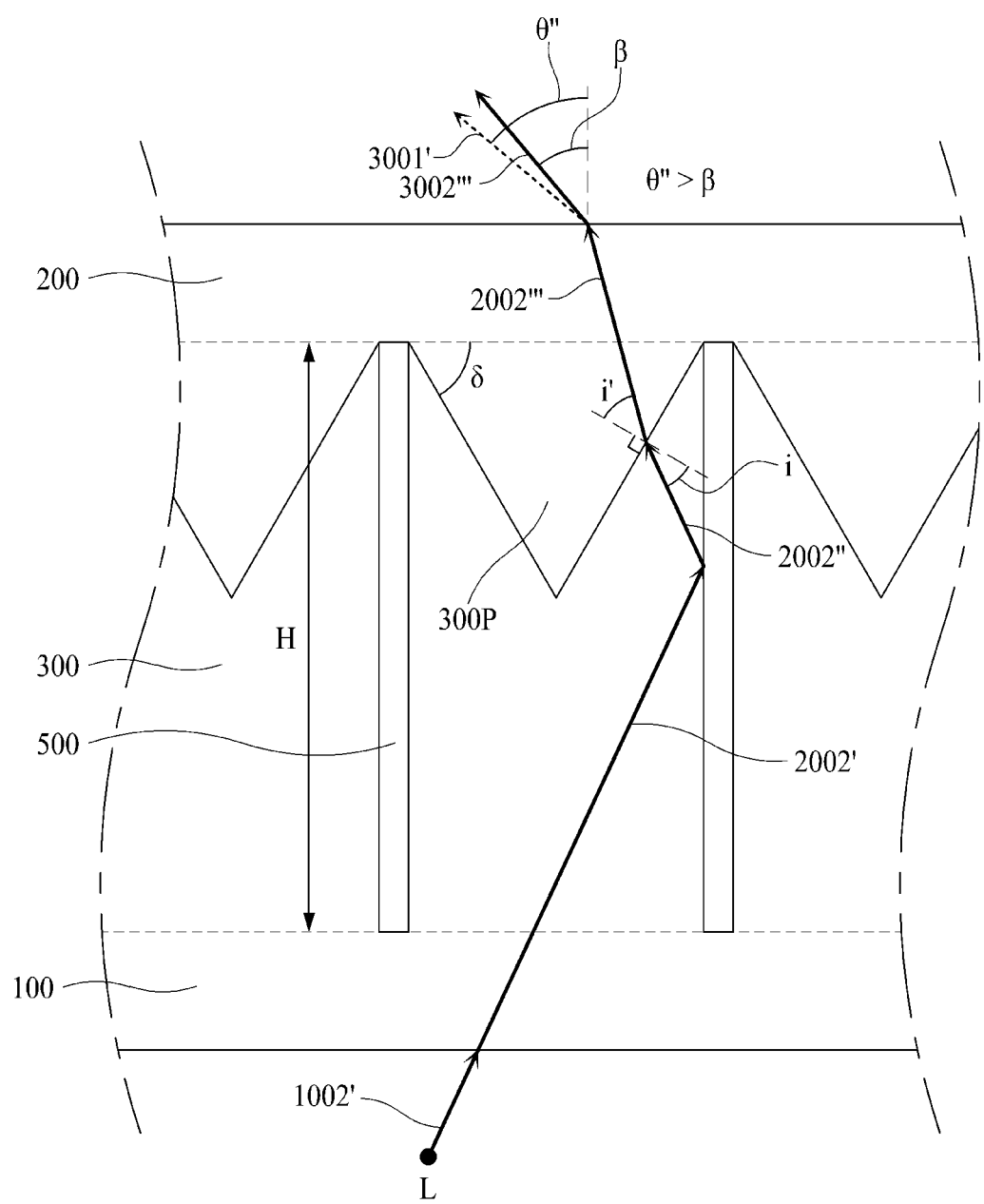
FIG. 6 is a cross sectional view illustrating a structure of the light control film and an operating mechanism thereof according to the third embodiment of the present disclosure.

Hereinafter, referring to FIG. 6, we will explain about the third embodiment of the present disclosure. FIG. 6 is a cross sectional view illustrating a structure of the light control film and a mechanism thereof according to the third embodiment of the present disclosure. The light control film LCF shown in FIG. 6 may have the very similar structure of the light control film LCF shown in FIG. 5. The difference in the third embodiment may be that the prism pattern 300P may be upper position of the middle layer 300 as contacting the upper layer 200.

The prism pattern 300P may have a triangular column shape of which cross-sectional shape is a triangle. For example, the bottom side of the triangle may be in contact with the upper layer 200, the upper vertex may be disposed from the inside of the middle layer 300 toward the lower layer 100. It is preferable that the triangle of the prism pattern 300P may be an isosceles triangle.

The prism pattern 300P may have the same refractive index as the upper layer 200. The middle layer 300 may have the same refractive index as the lower layer 100, but higher refractive index than the upper layer 200 and the prism pattern 300P. For example, the refractive index of the middle layer 300 may have the refractive index of 0.05~0.1 higher than the refractive index of the prism pattern 300P. In detail, the upper layer 200 and the prism pattern 300P may have the refractive index of 1.40, and the middle layer 300 and the lower layer 100 may have the refractive index of 1.45. In another example, the upper layer 200 and the prism pattern 300P may have the refractive index of 1.40 and the middle layer 300 and the lower layer 100 may have the refractive index of 1.50.

The prism pattern 300P according to the third embodiment may be for eliminating the leaked light propagating out of the viewing angle θ. For example, it is for controlling the light that may leak out of the viewing angle θ among the left incident light 1001 and 1001' or the right incident light 1002 and 1002' described in the first embodiment. Like the second embodiment, the base angel δ of the prism pattern 300P may have an angle selected one in a range of 45 degree to 75 degree. Preferably, the base angle δ of the prism pattern 300P may be any one in range of 60 degree to 70 degree.

Hereinafter, referring to FIG. 6, a mechanism for controlling the viewing angle in the light control film LCF having the prism pattern 300P according to the third embodiment of the present disclosure will be explained. For the convenience of explanation, only the light incident from the left area L, especially the right incident light is considered.

Among the right incident light 1002' incident from the left area L, the light entering between the upper end and the lower end of the nano light absorbing layer 500 are mostly absorbed by the nano light absorbing layer 500. However, as described in FIG. 3B, a small amount of light may be reflected, which may be become leakage light. Considering the right incident light 1002' that may cause such leakage, it proceeds to the right transmitted light 2002' which propagates without refraction until it passes through the lower layer 100 and the middle layer 300. This is because the lower layer 100 and the middle layer 300 have the same refractive index.

Some portions of the right transmitted light 2002', which are not absorbed by the nano light absorbing layer 500, may be reflected and propagated as the left reflected light 2002". The left reflected light 2002" may incident to the interface 400 of the prism pattern 300P and the middle layer 300. The left reflected light 2002" may be the left refracted light 2002''' which is refracted far from the normal direction of the interface 400. This is because that the middle layer 300 has the larger refractive index than the prism pattern 300P. That is, the angle of refraction i' of the left refracted light 2002''' is larger than the incident angle i of the left reflected light 2002" entering onto the interface 400.

As the result, the left refracted light 2002''' may be concentrated to the front direction (or normal direction) of the light control film LCF by the prism pattern 300P. After passing the upper layer 200, the left refracted light 2002''' may be the left emission light 3002''' and emitted out of the light control film LCF.

As there is air layer on the outside of the light control film LCF, the left emission light 3002''' may be refracted in a direction away from the normal direction. That is, the left emission light 3002''' may have a viewing angle β between the normal direction and the emission direction. In the third embodiment, the final viewing angle β may be smaller than the viewing angle θ is determined by the left emission light 3001 explained in the first embodiment. This is because the light which may be out of the viewing angle θ may be refracted as being closer to the normal direction of the top surface of the light control film LCF by the prism pattern 300P, as shown in FIG. 6. As the lights are concentrating to the front direction, the light path may be controlled not to be out of the viewing angle θ.

For the light incident from the central area C may be same with the case explained in the second embodiment, so the duplicated explanation may be omitted.

Consequently, the light control film LCF according to the third embodiment may have the structure in which the leaked light out of the viewing angle θ defined by the light control film LCF according to the first embodiment may be further controlled to have narrower viewing angle. In other words, even though almost of all leaked light which may have the emission angle of θ" may be reflected by the nano light absorbing layer 500, they may be refracted by the prism pattern 300P within the emission angle narrower than the emission angle of θ", so that most of all light may be controlled as propagating within the viewing angle θ.

Fourth Embodiment

Figure 7A:
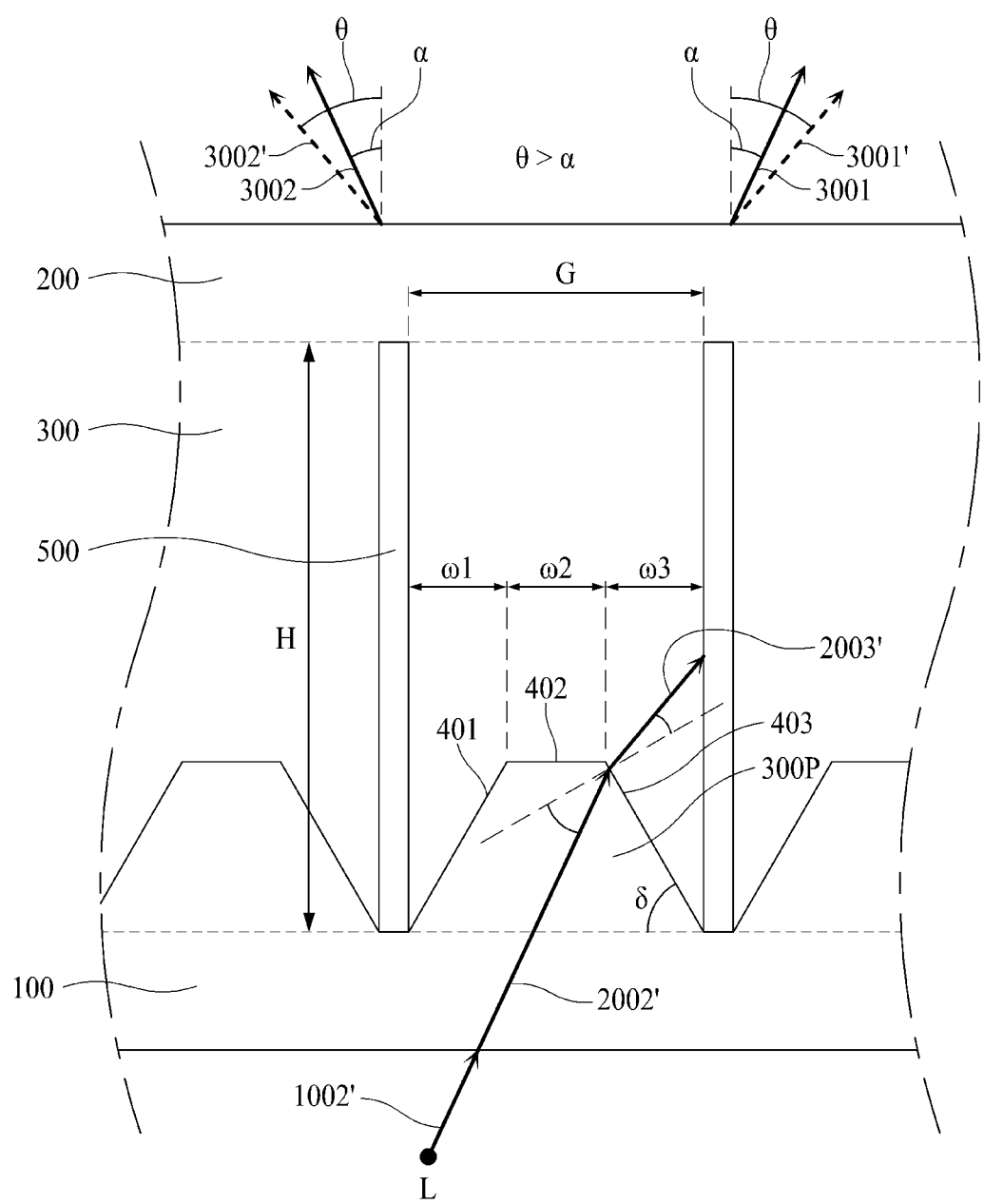
FIG. 7A is a cross sectional view illustrating a structure of the light control film and an operating mechanism thereof according to the fourth embodiment of the present disclosure.
Figure 7B:
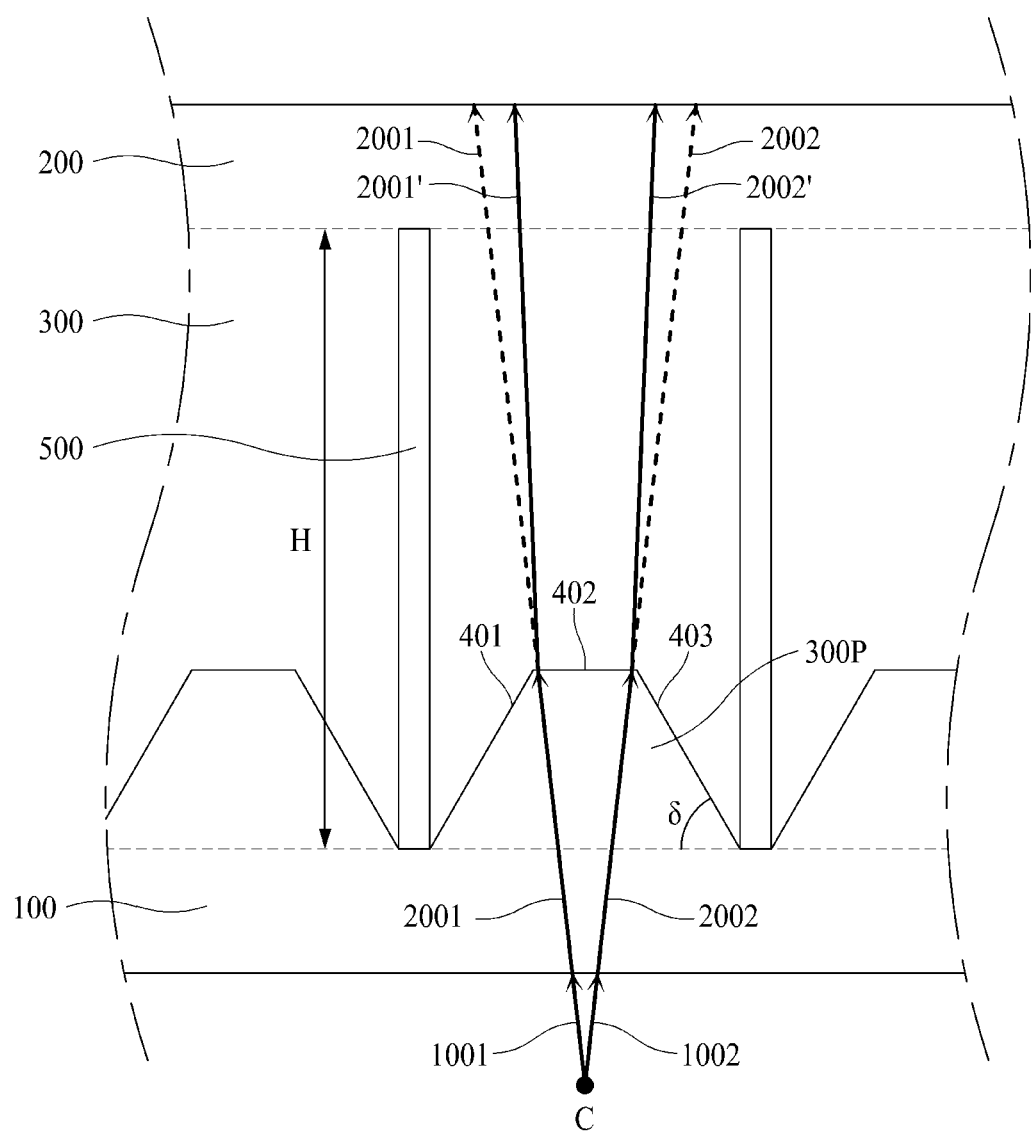
FIG. 7B is a cross-sectional view illustrating a concentrating mechanism of the light incident into the central area of the light control film.

Hereinafter, referring to FIGS. 7A and 7B, we will explain about the fourth embodiment of the present disclosure. FIG. 7A is a cross sectional view illustrating a structure of the light control film and a mechanism thereof according to the fourth embodiment of the present disclosure. FIG. 7B is a cross-sectional view illustrating a concentrating mechanism of the light incident into the central area of the light control film.

Referring to FIG. 7A, the light control film LCF according to the fourth embodiment may be similar with the first embodiment shown in FIG. 5. The difference is that the prism pattern 300P has a cross-sectional shape of trapezoid.

For example, the prism pattern 300P may be a rectangular pillar of which cross-sectional shape has a trapezoidal shape. The trapezoid of the prism pattern 300P may include a bottom side, an upper side 402, a left slanted side 401 and a right slanted side 403. The bottom side may be in contact with the lower layer 100, so the bottom side may be the upper side of the lower layer 100. The base angle δ of the prism pattern 300P may have an angle selected one in a range of 45 degree to 75 degree. Preferably, the base angle δ of the prism pattern 300P may be any one in range of 60 degree to 70 degree.

The left slanted side 401, the upper side 402 and the right slanted side 403 may be disposed within the interval G of the nano light absorbing layer 500, and the ratio of each of the width may be 1:1:1. For example, the horizontal width ω1 of the left slanted side 401, the horizontal width ω2 of the upper side 402 and the horizontal width ω3 of the right slanted side 403 may have the same width.

In another example, the ratio of the horizontal width ω1 of the left slanted side 401, the horizontal width ω2 of the upper side 402 and the horizontal width ω3 of the right slanted side 403 may be 1:2:1. The ratio of the horizontal width ω1 of the left slanted side 401, the horizontal width ω2 of the upper side 402 and the horizontal width ω3 of the right slanted side 403 may be selected any one value in range of 1:1:1 to 1; 3:1.

Referring to FIG. 7A, as explained in the second embodiment, the light which may be leaked out of the viewing angle θ after being reflected by the nano absorbing layer 500 among the right incident light from the left area L may be refracted by the prism pattern 300P, so that the light may be absorbed by the nano light absorbing layer 500. Even though not shown in figures, the light which may be leaked out of the viewing angle θ after being reflected by the nano absorbing layer 500 among the left incident light from the right area R may be refracted by the prism pattern 300P, so that the light may be absorbed by the nano light absorbing layer 500. As the result, as shown in FIG. 5, the emission light going out from the light control film LCF may have the propagating angle narrower than the viewing angle θ. The light path illustrated over the upper layer 200 in FIG. 7A is for explaining that it is same with the light path of the emission lights according to the FIG. 5.

Referring to FIG. 7B, the light entering from the central area C will be explained. In convenience, the lights incident into the upper side 402 of the prism pattern 300P may be considered for explanation. The light entering into the upper side 402 of the prism pattern 300P may be the diffused light between the left incident light 1001 and the right incident light 1002. The normally incident light to the upper surface 402 may be considered, but the left incident light 1001 and the right incident light 1002 which may affect to the emission angle will be considered mainly.

The left incident light 1001 entering into the lower layer 100 may pass as the left transmitted light 2001 through the lower layer 100 and the prism pattern 300P without the refraction. At the upper side 402 of the prism pattern 300P contacting the middle layer 300, the left transmitted light 2001 may be refracted as being closer to the normal direction of the upper side 402. That is, the left transmitted light 2001 may be propagated as the left refracted light 2001' through the middle layer 300. As comparing with the FIG. 3B, the light path of the left refracted light 2001' may be the concentrated into the front direction rather than the light path (illustrated by dotted line) of the left transmitted light 2001 where there is no prism pattern 300P.

The right incident light 1002 entering into the lower layer 100 may pass as the right transmitted light 2002 through the lower layer 100 and the prism pattern 300P without refraction. At the upper side 402 of the prism pattern 300P contacting the middle layer 300, the right transmitted light 2002 may be refracted as being closer to the normal direction of the upper side 402. That is, the right transmitted light 2002 may be refracted at the upper side 402 and propagated as the right refracted light 2002' through the middle layer 300. As compared with FIG. 3B, the light path of the right refracted light 2002' may be concentrated into the front direction rather than the light path (illustrated by dotted line) of the right transmitted light 2002 where there is no prism pattern 300P.

Consequently, the light control film LCF according to the third embodiment may have the structure in which the leaked light out of the viewing angle θ defined by the light control film LCF according to the first embodiment may be further controlled to have narrower viewing angle. In the case that the prism pattern 300P has the triangle shape as explained in the second and third embodiments, the diffraction of the luminescent may be increased due to the extremely concentrated light by the sharpened apex. However, as there is no apex point in the fourth embodiment, the diffraction of the luminescent may not be occurred. Due to the trapezoid shape of the prism pattern 300P, much more light may be concentrated to the front direction so that the front luminescent may be improved.

Fifth Embodiment

Figure 8:
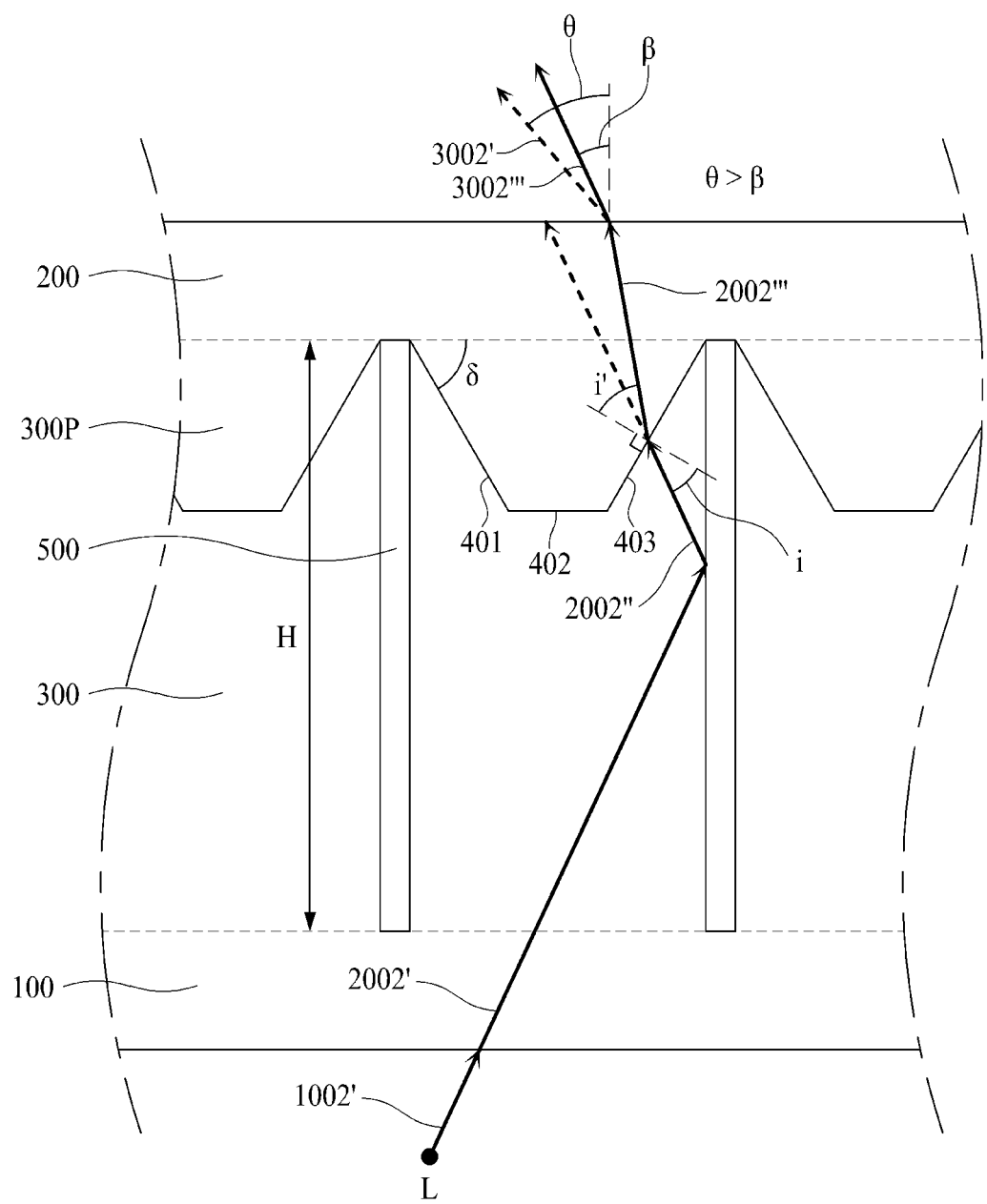
FIG. 8 is a cross sectional view illustrating a structure of the light control film and an operating mechanism thereof according to the fifth embodiment of the present disclosure.

Hereinafter, referring to FIG. 8, we will explain about the fifth embodiment of the present disclosure. FIG. 8 is a cross sectional view illustrating a structure of the light control film and a mechanism thereof according to the fifth embodiment of the present disclosure.

Referring to FIG. 8, the light control film LCF according to the fifth embodiment of the present disclosure may have very similar structure with that of the fourth embodiment as shown in FIG. 7A. The different point may be that the prism pattern 300P may be disposed as being in contact with the upper layer 200 at the upper portions of the middle layer 300.

The trapezoid of the prism pattern 300P may include a bottom side, an upper side 402, a left slanted side 401, and a right slanted side 403. The bottom side may be in contact with the upper layer 200, so the bottom side may be the bottom side of the upper layer 200. The base angle δ of the prism pattern 300P may have an angle selected one in a range of 45 degree to 75 degree. Preferably, the base angle δ of the prism pattern 300P may be any one in range of 60 degree to 70 degree.

The left slanted side 401, the upper side 402 and the right slanted side 403 may be disposed within the interval G of the nano light absorbing layer 500, and the ratio of each of the width may be 1:1:1. For example, the horizontal width ω1 of the left slanted side 401, the horizontal width ω2 of the upper side 402 and the horizontal width ω3 of the right slanted side 403 may have the same width.

In another example, the ratio of the horizontal width ω1 of the left slanted side 401, the horizontal width ω2 of the upper side 402 and the horizontal width ω3 of the right slanted side 403 may be 1:2:1. The ratio of the horizontal width ω1 of the left slanted side 401, the horizontal width ω2 of the upper side 402 and the horizontal width ω3 of the right slanted side 403 may be selected any one value in range of 1:1:1 to 1; 3:1.

The prism pattern 300P may have the same refractive index of the upper layer 200. The middle layer 300 may have the same refractive index of the lower layer 100, but it may have the higher refractive index than the upper layer 100 and the prism pattern 300P. For example, the refractive index of the middle layer 300 may be 0.05~0.1 higher than that of the prism pattern 300P. In detail, the upper layer 200 and the prism pattern 300P may have the refractive index of 1.40, and the middle layer 300 and the lower layer 100 may have the refractive index of 1.45. In another example, the upper layer 200 and the prism pattern 300P may have the refractive index of 1.40 and the middle layer 300 and the lower layer 100 may have the refractive index of 1.50.

Hereinafter, referring to FIG. 8, the mechanism for controlling the viewing angle in the light control film LCF having the prism pattern 300P according to the fifth embodiment will be explained. For the convenience of explanation, only the light incident from the left area L, especially the right incident light is considered.

Among the right incident light 1002' incident from the left area L, the light entering between the upper end and the lower end of the nano light absorbing layer 500 are mostly absorbed by the nano light absorbing layer 500. However, as described in FIG. 3B, a small amount of light may be reflected, which may be become leakage light. Considering the right incident light 1002' that may cause such leakage, it proceeds to the right transmitted light 2002' which propagates without refraction until it passes through the lower layer 100 and the middle layer 300. This is because the lower layer 100 and the middle layer 300 have the same refractive index.

Some portions of the right transmitted light 2002', which are not absorbed by the nano light absorbing layer 500, may be reflected and propagated as the left reflected light 2002". The left reflected light 2002" may be incident to the right slanted side 403 of the prism pattern 300P interfaced with the middle layer 300. The left reflected light 2002" may be the left refracted light 2002''' which is refracted far from the normal direction of the right slanted side 403. This is because that the middle layer 300 has the larger refractive index than the prism pattern 300P. That is, the angle of refraction i' of the left refracted light 2002''' is larger than the incident angle i of the left reflected light 2002'' entering onto the interface 400.

As the result, the left refracted light 2002''' may be concentrated to the front direction (or normal direction) of the light control film LCF by the prism pattern 300P. After passing the upper layer 200, the left refracted light 2002''' may be the left emission light 3002''' and emitted out of the light control film LCF.

As there is air layer on the outside of the light control film LCF, the left emission light 3002''' may be refracted in a direction away from the normal direction. That is, the left emission light 3002''' may have a viewing angle β between the normal direction and the emission direction. In the fifth embodiment, like the third embodiment, the final viewing angle β may be smaller than the viewing angle θ is determined by the left emission light 3001 explained in the first embodiment. This is because that the light which may be out of the viewing angle θ may be refracted as being closer to the normal direction of the top surface of the light control film LCF by the prism pattern 300P, as shown in FIG. 8. As the light are concentrating to the front direction, the light path may be controlled not to be out of the viewing angle θ.

For the light incident from the central area C may have the diverged light path different from the case explained in the fourth embodiment. This is because that the refractive index of the prism pattern 300P may be lower than the refractive index of the middle layer 300. The diverged angle may be controlled not to be so much larger than the viewing angle θ by controlling the difference of the refraction index between the middle layer 300 and the prism pattern 300P. In one embodiment, the difference of the refractive index between the middle layer 300 and the prism pattern 300P may be in range of 0.05 to 0.1.

Sixth Embodiment

Figure 9:
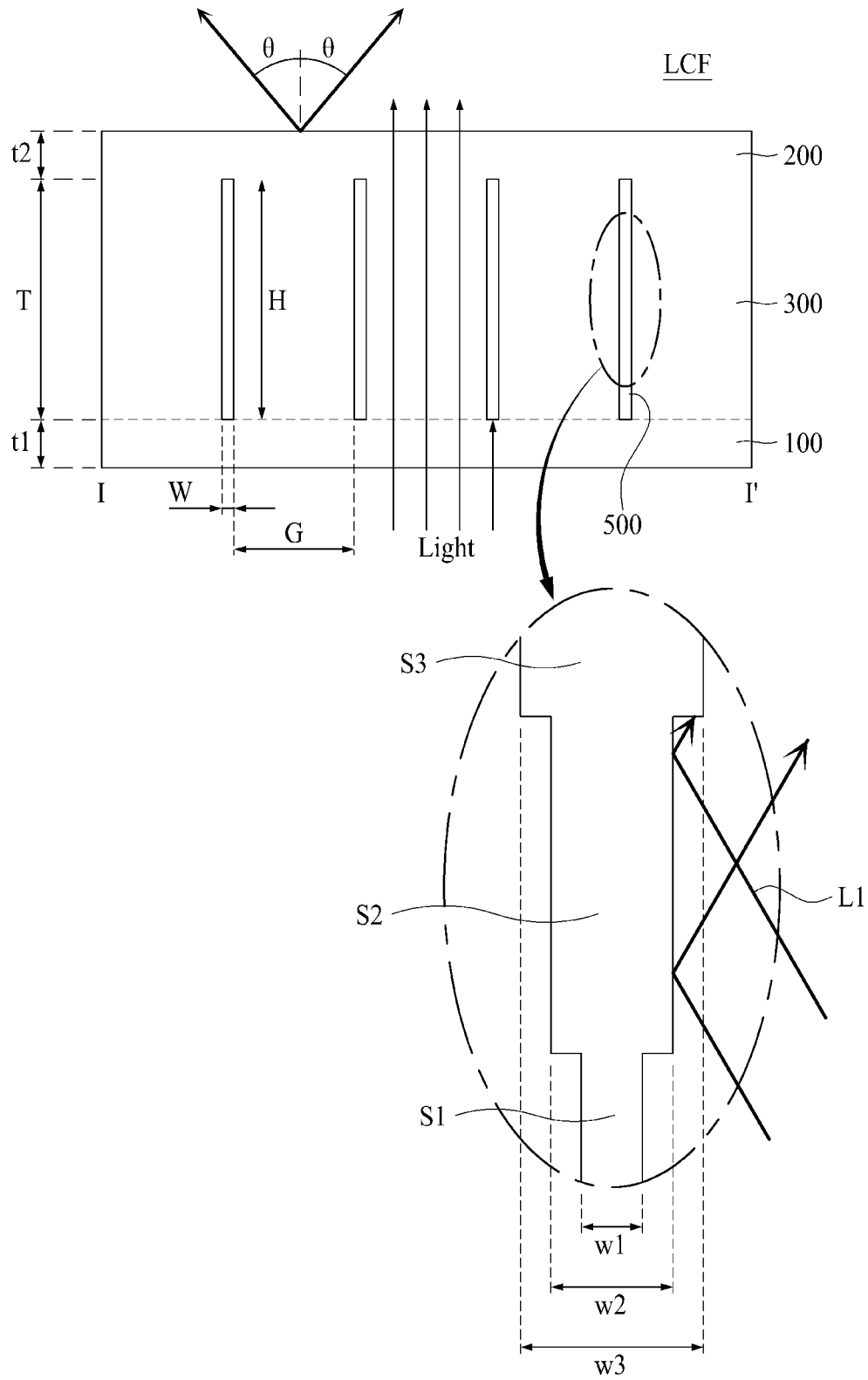
FIG. 9 is a cross-sectional view comparing the ranges of the viewing angles set by the light control films and an operating mechanism thereof according to the third embodiment to the fifth embodiment of the present disclosure.

Hereinafter, referring to FIG. 9, the sixth embodiment of the present disclosure will be explained. FIG. 9 is a cross-sectional view comparing the ranges of the viewing angles set by the light control films and an operating mechanism thereof according to the third embodiment to the fifth embodiment of the present disclosure.

The light absorbing layer 500 may include a plurality of sectors divided along the height direction. The nano light absorbing layer 500 in each sector may have different width. Especially, the widths are gradually narrower or wider according to the order of sectors.

In one example, referring to the enlarged oval part of FIG. 9, the nano light absorbing layer 500 may have 3 sectors. In one embodiment, the width of the sector which is being closet to the light incident direction may be the narrowest, and the width of the sector which is being far from the light incident direction may be the widest. In detail, the first sector S1 may be closed to the lower layer 100, the third sector S3 may be closed to the upper layer 200, and the second sector S2 may be disposed between the first sector S1 and the third sector S3. The first sector S1 may have the first width W1, the narrowest width, the second sector S2 may have the second width W2 wider than the first width W1, and the third sector S3 may have the third width W3 wider than the second width W2.

In the case of FIG. 9, some of light L1 among the light incident onto and reflected by the nano light absorbing layer 500 after entering from the lower layer 100 may be blocked by the stepped portion between the sectors due to the width difference. Even though almost all of the light entering on the nano light absorbing layer 500 may be absorbed, small amounts of the light satisfying the total reflection condition may be reflected. These reflected light may propagate out of the viewing angle θ. However, for the case that the nano light absorbing layer 500 having step differenced sectors, some of the total reflected light may be further blocked, as shown in FIG. 9, so that the light amounts out of the viewing angle θ may be further reduced.

Figure 10:
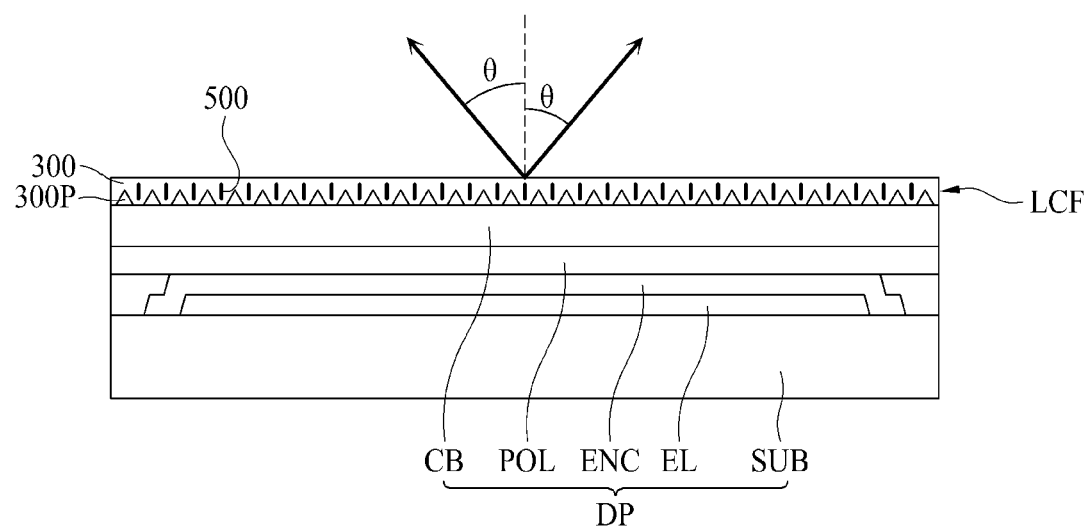
FIG. 10 is a cross-sectional view illustrating structure of organic light emitting displays having the light control film according to the present disclosure.

Hereinafter, referring to FIG. 10, we will explain about the display having the light control film LCF according to the present disclosure. FIG. 10 is a cross-sectional view illustrating structure of organic light emitting displays having the light control film according to the present disclosure.

Referring to FIG. 10, the display may comprise a display panel DP and a light control film LCF according to the first embodiment of the present disclosure, and the light control film LCF is disposed on the front surface of the display panel DP. The display panel DP may include a substrate SUB, an emission layer EL formed on the substrate SUB, an encapsulation layer ENC covering the emission layer EL, an optical layer POL disposed on the encapsulation layer ENC and a cover plate CB disposed on the optical layer POL. In some cases, the optical layer POL and the cover plate CB may be formed as an integrated one body.

The display panel DP may include a self-luminescent display panel or a curved self-luminescent display panel. For example, the display panel DP may include a luminescent display panel, a micro light emitting diode display panel, a flexible luminescent display panel, a flexible micro light emitting diode display panel, or a quantum dot luminescent display panel, but the embodiment is not limited thereto.

The substrate SUB of the display panel DP may be preferably formed of a transparent material. The emission layer EL may include a plurality pixel areas arrayed in a matrix manner Each of pixel areas may have a driving element and a light emitting element. The driving element may include a thin film transistor and a storage capacitance. The light emission element may be an electroluminescence element of which brightness of the light may be controlled by the driving element. The electroluminescence element may include an organic light emitting diode or an inorganic light emitting diode.

The encapsulation layer ENC is for protecting the emission layer EL and prevents air or foreign materials from penetrating into the emission layer EL. The encapsulation layer ENC may have a structure in which an inorganic layer and an organic layer are alternately stacked in multiple layers.

The optical layer POL is for improving the characteristics of the display. It may be a polarizing film to prevent the problem of deterioration the display performance by reflecting light from the outside. For example, the optical layer POL may be a quarter wave plate.

The cover plate CB may be a transparent rigid plate such as glass substrate. The cover plate CB may be a transparent protective substrate for reducing damage due to external force to the optical layer POL, the encapsulation layer ENC and the emission layer EL disposed below the cover plate CB.

The light control film LCF according to the present disclosure may be attached to the outer surface of the cover plate CB. Viewing from the front of the display, when it is necessary to narrow the viewing angel in the vertical direction (i.e., in the Y-axis in FIG. 1), it is preferable that the length l of the nano light absorbing layer 500 is disposed along the line from left to right (i.e., along the X-axis in FIG. 1) of the display. Otherwise, when it is necessary to narrow the viewing angle in the horizontal direction (i.e., in the X-axis in FIG. 1), it is preferable that the length l of the nano light absorbing layer 500 is disposed along the line from up to down (i.e., along the Y-axis in FIG. 1) of the display.

Having a structure in which thin layers in nanometer scale of 1.0 μm or less are disposed with intervals of 20 μm or less, the light control film LCF according to the present disclosure may function as a linear polarization film. For example, among the light incident into the light control film LCF from outside, all of the polarization components along the length direction of the nano light absorbing layer 500 may be absorbed, but only the polarization components along the width direction of the nano light control absorbing layer 500 may be transmitted.

After that, the linearly polarized light in the width direction (or arrangement direction) of the nano light absorbing layer 500 by the light control film LCF may be converted to circularly polarized light by the quarter wave plate which is an optical layer POL disposed under the cover plate CB. When this circularly polarized light is reflected from the emission layer EL, the phase of the light may be reversed. For example, when the first circularly polarized light is the left circularly polarized light, then the reflected circularly polarized light is the right circularly polarized light. The circularly polarized light having reversed phase is converted to the linearly polarized light by the quarter wave plate. Here, the direction of the linearly polarized light is along to the length direction of the nano light absorbing layer 500 of the light control film LCF. Therefore, the reflected light may be absorbed by the nano light absorbing layer 500. Consequently, even though the ambient light are reflected at the emission layer EL of the display, they are not emitted out of the display, but absorbed or eliminated by the nano light absorbing layer 500.

The display having the light control film LCF according to the first embodiment of the present disclosure may have a narrow viewing angle of which ranges from the front direction to the left side and to the right side (or to the upside and to the down side) are each θ°, respectively. Here, the front direction of the display is coincided with the normal direction of the display surface.

As such, the light control film LCF according to the present disclosure may adjust the viewing angle, as well as have a linearly polarization function. Therefore, a separated linear polarization film may be not required to remove the external reflected light. So, the overall thickness of the display may be ensured thinner than related art.

Furthermore, according to the second to sixth embodiments of the present disclosure, the leaked light out of the viewing angle θ by the light reflected by the nano light absorbing layer 500 in the first embodiment may be further blocked and/or absorbed to minimize or to eliminate the leaked light.

Features, structures, effects and so on described in the above described examples of the present disclosure are included in at least one example of the present disclosure, and are not necessarily limited to only one example. Furthermore, features, structures, effects and so on exemplified in at least one example of the present disclosure may be implemented by combining or modifying other examples by a person having ordinary skilled in this field. Therefore, contents related to such combinations and modifications should be interpreted as being included in the scope of the present application.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A light control film comprising:
a lower layer having a first axis and a second axis;
an upper layer facing the lower layer;
a middle layer having a thickness disposed between the lower layer and the upper layer;
a plurality of nano light absorbing layers arrayed with a predetermined interval along the first axis in the middle layer, each of the plurality of nano light absorbing layers having a width along the first axis, a length along the second axis, and a height corresponding to the thickness of the middle layer; and
a prism pattern disposed between each pair of the plurality of nano light absorbing layers, and the prism pattern located inside of the middle layer,
wherein the prism pattern is contact with at least one of the lower layer and the upper layer,
wherein the prism pattern has a first refractive index, and
wherein the middle layer has a second refractive index that is greater than the first refractive index.

2. The light control film according to claim 1, wherein the width of each of the plurality of nano light absorbing layers is selected any one in a range of 0.1 μm to 10 μm.

3. The light control film according to claim 1, wherein a ratio between the predetermined interval and the height of each of the plurality of nano light absorbing layers is in a range of 1:1 to 1:4.

4. The light control film according to claim 1, wherein each of the lower layer, the middle layer, and the upper layer have refractive indices higher than that of air.

5. The light control film according to claim 1, wherein each of the plurality of nano light absorbing layers has at least two thin layers stacked with each other.

6. The light control film according to claim 5, wherein any one thin layer of the at least two thin layers has a film thickness in a range of 0.01 μm to 1.0 μm.

7. The light control film according to claim 5, wherein each of the plurality of nano light absorbing layers includes:
a first thin layer having a first reflection ratio; and
a second thin layer having a second reflection ratio different from the first reflection ratio.

8. The light control film according to claim 7, wherein each of the plurality of nano light absorbing layers further includes a third thin layer having a third reflection ratio different from the first reflection ratio and the second reflection ratio.

9. The light control film according to claim 1, wherein each of the plurality of nano light absorbing layer includes:
a first thin layer having a first transmittance ratio; and
a second thin layer having a second transmittance ratio different from the first transmittance ratio.

10. The light control film according to claim 9, wherein each of the plurality of nano light absorbing layer further includes a third thin layer having a third transmittance ratio different from the first transmittance ratio and the second transmittance ratio.

11. The light control film according to claim 1, wherein the prism pattern is in contact with the lower layer,
wherein the lower layer has the first refractive index, and
wherein the upper layer has the second refractive index larger than the first refractive index.

12. The light control film according to claim 11, wherein a cross-sectional shape of the prism pattern is an isosceles triangle of which a base side is in contact with the lower layer, and
wherein a base angle of the isosceles triangle is any one in range of 45 degrees to 75 degrees.

13. The light control film according to claim 11, wherein the prism pattern has a cross-sectional shape of trapezoid including:
a lower side being in contact with the lower layer;
an upper side parallel to the lower side;
a left slanted side connecting the lower side and the upper side; and
a right slanted side connecting the lower side and the upper side,
wherein a base angle of the trapezoid is any one in range of 45 degrees to 75 degrees, and
wherein horizontal widths of the left slanted side, the upper side and the right slanted side have a ratio in range of 1:1:1 to 1:3:1.

14. The light control film according to claim 1, wherein the prism pattern is in contact with the upper layer,
wherein the upper layer has the first refractive index, and
wherein the lower layer has the second refractive index larger than the first refractive index.

15. The light control film according to claim 14, wherein a cross-sectional shape of the prism pattern is an isosceles triangle of which base side is in contact with the upper layer, and
wherein a base angle of the isosceles triangle is any one in range of 45 degrees to 75 degrees.

16. The light control film according to claim 14, wherein the prism pattern has a cross-sectional shape of trapezoid including:
a lower side being in contact with the upper layer;
an upper side parallel to the lower side;
a left slanted side connecting the lower side and the upper side; and
a right slanted side connecting the lower side and the upper side,
wherein a base angle of the trapezoid is any one in range of 45 degrees to 75 degrees, and
wherein horizontal widths of the left slanted side, the upper side and the right slanted side have a ratio in range of 1:1:1 to 1:3:1.

17. The light control film according to claim 1, wherein the nano light absorbing layer includes at least one selected of silicon nitride (SiN), titanium nitride (TiN), silicon carbide (SiC), Tantalum (Ta), Titanium (Ti), Tungsten (W), copper oxide (CuO), aluminum oxide (Al2O3), iron oxide (Fe3O4), carbon allotropy or tantalum oxide (Ta2O5).

18. The light control film according to claim 1, wherein each of the plurality of nano light absorbing layers includes:
a first sector being in close to the lower layer and having a first width;
a third sector being in close to the upper layer and having a third width; and
a second sector disposed between the first sector and the third sector, and having a second width wider than the first width and narrower than the third width.

19. The light control film according to claim 1, wherein a ratio between the predetermined interval and the width of the nano light absorbing layer is in a range of 10:1 to 20:1.

20. A display comprising:
a substrate having a plurality of pixels;
an emission layer including a driving element and a light emitting element disposed at each of pixels;
an encapsulation layer covering the emission layer;
an optical layer on the encapsulation layer;
a cover plate on the optical layer; and
the light control film according to claim 1.

* * * * *